United States Patent
Sawada et al.

(10) Patent No.: US 6,391,223 B1
(45) Date of Patent: May 21, 2002

(54) PIEZOELECTRIC CERAMIC COMPOSITION AND PIEZOELECTRIC CERAMIC ELEMENT USING THE SAME

(75) Inventors: Takuya Sawada, Moriyama; Masahiko Kimura, Kusatsu; Akira Ando, Omihachiman; Koichi Hayashi, Shiga-ken, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/577,087

(22) Filed: May 24, 2000

(30) Foreign Application Priority Data

May 24, 1999 (JP) .............................. 11-143069
Aug. 27, 1999 (JP) .............................. 11-241358
Feb. 15, 2000 (JP) .............................. 2000-036154

(51) Int. Cl.⁷ .............................. H01B 3/12; H01G 4/12; H01L 41/00; H03H 9/00
(52) U.S. Cl. .............................. 252/62.9 R; 501/134; 501/135; 501/136
(58) Field of Search .............................. 501/134, 135, 501/136; 252/62.9 R

(56) References Cited

U.S. PATENT DOCUMENTS

| | | | |
|---|---|---|---|
| 4,761,242 A | 8/1988 | Suzuki et al. | 252/62.9 R |
| 4,978,646 A | 12/1990 | Bardhan et al. | 501/134 |
| 6,248,254 B1 * | 6/2001 | Kimura et al. | 252/62.9 R |

FOREIGN PATENT DOCUMENTS

EP     0878837     11/1998

* cited by examiner

Primary Examiner—C. Melissa Koslow
(74) Attorney, Agent, or Firm—Dickstein Shapiro Morin & Oshinsky LLP

(57) ABSTRACT

A piezoelectric ceramic composition that can yield a piezoelectric ceramic capable of being fired at a temperature as low as 1100° C. or below and exhibiting an electromechanical coupling coefficient sufficient for providing a piezoelectric ceramic element for practical use, and a piezoelectric ceramic element using the same, wherein the piezoelectric ceramic composition comprises a principal component represented by a general formula of $CaBi_4(Ti_{1-y}Si_y)_4O_{15}$ with y within the range of $0<y\leq0.5$, possibly containing other divalent or trivalent elements, and wherein a piezoelectric ceramic element, in which electrodes are formed on both principal faces of the piezoelectric ceramic while forming an inner electrode within the piezoelectric ceramic, can be formed using the piezoelectric ceramic composition.

20 Claims, 1 Drawing Sheet

PIEZOELECTRIC CERAMIC COMPOSITION AND PIEZOELECTRIC CERAMIC ELEMENT USING THE SAME

BACKGROUND OF THE INVENTION

1. Field of the Invention

The present invention relates to a piezoelectric ceramic composition and a piezoelectric ceramic element using the same. The present invention particularly relates to a piezoelectric ceramic composition to be used for materials for, for example, piezoelectric ceramic filters, piezoelectric oscillators and piezoelectric vibrators, and a piezoelectric ceramic element using the same.

2. Description of the Related Art

Piezoelectric ceramic compositions containing, for example, lead zirconate titanate ($Pb(Ti_xZr_{1-x})O_3$) or lead titanate ($PbTiO_3$) as a principal component have been widely used for piezoelectric ceramic compositions intended for use in piezoelectric ceramic elements such as piezoelectric ceramic filters, piezoelectric ceramic oscillators and piezoelectric ceramic vibrators.

Lead oxide is usually used in the manufacturing process of the piezoelectric ceramic composition mainly composed of lead titanate zirconate and lead titanate. Consequently, facilities such as a filter for removing lead dusts should be provided in order to prevent pollution caused by evaporation of lead oxide, thus resulting in a high production cost. Uniformity of the product is also decreased due to evaporation of lead oxide.

For solving the problems as described above, piezoelectric ceramic compositions mainly composed of layered bismuth compounds such as $(Ca_{1-x}M_x)Bi_4Ti_4O_{15}$, or compounds prepared by adding Mn therein, have been used. Such piezoelectric ceramic composition do not cause the troubles described above since they do not contain any lead oxide.

However, the conventional piezoelectric ceramic composition mainly composed of $(Ca_{1-x}M_x)Bi_4Ti_4O_{15}$ needs to be fired at a temperature as high as 1150° C. or above in order to obtain a ceramic exhibiting an electromechanical coupling coefficient kt high enough for practical uses (10% or more). Accordingly, an electrode material having a higher melting point than the firing temperature needs to be used for piezoelectric ceramic elements comprising inner electrodes, forcing the use of expensive materials such as platinum and palladium. It is a problem that the production cost of the piezoelectric ceramic element is increased by using such expensive electrode materials.

SUMMARY OF THE INVENTION

Accordingly, the main object of the present invention is to provide a piezoelectric ceramic composition that can be fired at a temperature as low as 1100° C. or below besides being able to obtain a piezoelectric ceramic that exhibits an electromechanical coupling coefficient kt of the order sufficient for practical uses, and a piezoelectric ceramic element using the piezoelectric ceramic composition.

In one aspect, the present invention provides a piezoelectric ceramic composition containing a principal component represented by a general formula of $CaBi_4(Ti_{1-y}Si_y)_4O_{16}$, wherein y is within the range of $0<y\leq0.5$.

The present invention also provides a piezoelectric ceramic composition containing a principal component represented by a general formula of $(Ca_{1-x}M_x)Bi_4((Ti_{1-y}Si_y)_4O_{15}$ in which M is M' or M", wherein M' is a divalent metallic element other than Ca and M" is a trivalent metallic element other than Bi, and wherein y is within the range of $0<y\leq0.5$ and $0<x\leq0.5$.

Preferably, x is within the range of $0<x\leq0.5$ when M in the principal component is M', a divalent metallic element, and x is within the range of $0<x\leq0.3$ when M is M", a trivalent metallic element in the piezoelectric ceramic composition containing the divalent or trivalent metallic element M.

It is also preferable that M in the principal component is at least one of the elements Mg, Sr, Ba, La, Ce, Pr, Nd, Sm, Gd, Dy, Er, Yb, Sc and Y in the piezoelectric ceramic composition containing the divalent or trivalent metallic element M.

The present invention also provides a piezoelectric ceramic composition containing a principal component represented by a general formula of $(Ca_{1-x}M"_{2x/3})Bi_4(Ti_{1-y}Si_y)_4O_{15}$ in which M" represents the trivalent metallic element other than Bi, wherein x is within the range of $0<x\leq0.45$ and y is within the range of $0<y\leq0.5$.

It is preferable that M" in the principal component is at least one of the elements La, Ce, Pr, Nd, Sm, Gd, Dy, Er, Yb, Sc and Y in the piezoelectric ceramic composition containing the trivalent metallic element M".

The present invention also provides a piezoelectric ceramic composition comprising a principal component represented by a general formula of $CaBi_4Ti_4O_{15}$, containing about 0.5 mol or less (excluding zero) of Si relative to 1 mol of Bi in the principal component represented by the general formula described above, and containing about 0.125 mol or less (excluding zero) of a divalent metallic element other than Ca relative to 1 mol of Bi in the principal component represented by the general formula as described above, or about 0.075 mol or less (excluding zero) of a trivalent metallic element other than Bi relative to 1 mol of Bi in the principal component represented by the general formula as described above.

In the piezoelectric ceramic composition containing the divalent metallic element or the trivalent metallic element, these metallic elements are preferably at least one of the elements Mg, Sr, Ba, La, Ce, Pr, Nd, Sm, Gd, Dy, Er, Yb, Sc and Y.

The piezoelectric ceramic composition may contain about 5.0% by weight or less of manganese calculated as $MnCO_3$ relative to 100% parts by weight of the principal component.

The present invention also provides a piezoelectric ceramic element comprising electrodes formed on the piezoelectric ceramic using any one of the piezoelectric ceramic compositions as described above.

A piezoelectric ceramic having an electromechanical coupling coefficient of 10% or more can be obtained by firing the piezoelectric ceramic composition as described above at a temperature of 1100° C. or below.

The piezoelectric ceramic element, in which electrodes are formed on the piezoelectric ceramic using the piezoelectric ceramic composition as hitherto described, has good electric characteristics while enabling the production cost to be reduced.

These and other objects, features and advantages of the present invention as hitherto described will be made more obvious from the detailed descriptions of the embodiments according to the present invention with reference to the attached drawings.

DESCRIPTION OF THE PREFERRED EMBODIMENT

A first embodiment of the piezoelectric ceramic composition according to the present invention contains a principal component represented by a general formula of $CaBi_4(Ti_{1-y}Si_y)_4O_{15}$ in which y is within the range of $0<y\leq0.5$.

Alternatively, a second embodiment of the piezoelectric ceramic composition according to the present invention contains a principal component represented by a general formula of $(Ca_{1-x}M_x)Bi_4(Ti_{1-y}Si_y)_4O_{15}$ in which M is M' or M" and M' represents a divalent metallic element other than Ca and M" represents a trivalent metallic element other than Bi, wherein y is within the range of $0<y\leq0.5$. It is preferable that x is within the range of $0<x\leq0.5$ when M is M', a divalent metallic element, and x is within the range of $0<x\leq0.3$ when M is M", a trivalent metallic element. Elements such as Mg, Sr, Ba, La, Ce, Pr, Nd, Sm, Gd, Dy, Er, Yb, Sc and Y may be used as the divalent or trivalent metallic element M1 in the principal component as described above. These elements may be used alone or in combination.

Also, a third embodiment of the piezoelectric ceramic composition according to the present invention contains a principal component represented by a general formula of $(Ca_{1-x}M''_{2x/3})Bi_4(Ti_{1-y}Si_y)_4O_{15}$ in which M" represents the trivalent metallic element other than Bi, wherein x is within the range of $0<x\leq0.45$ and y is within the range of $0<y\leq0.5$. Elements such as La, Ce, Pr, Nd, Sm, Gd, Dy, Er, Yb, Sc and Y are used for the trivalent metallic element M" in the principal component. These elements may be used alone or in combination.

The piezoelectric ceramic composition according to the present invention also comprises a fourth embodiment of principal component represented by the general formula of $CaBi_4Ti_4O_{15}$, containing about 0.5 mol or less (excluding zero) of Si relative to 1 mol of Bi in the principal component represented by the general formula, and containing about 0.125 mol or less (excluding zero) of a divalent metallic element other than Ca relative to 1 mol of Bi in the principal component represented by the general formula, or about 0.075 mol or less (excluding zero) of a trivalent metallic element other than Bi relative to 1 mol of Bi in the principal component represented by the general formula. Metallic elements such as Mg, Sr, Ba, La, Ce, Pr, Nd, Sm., Gd, Dy, Er, Yb, Sc and Y are used in the piezoelectric ceramic composition containing these divalent metallic elements or the trivalent metallic elements. These elements may be used alone or in combination.

Manganese may be present in a proportion of about 5% by weight as converted into $MnCO_3$ relative to 100% by weight of the principal component as described above.

Figure 1:
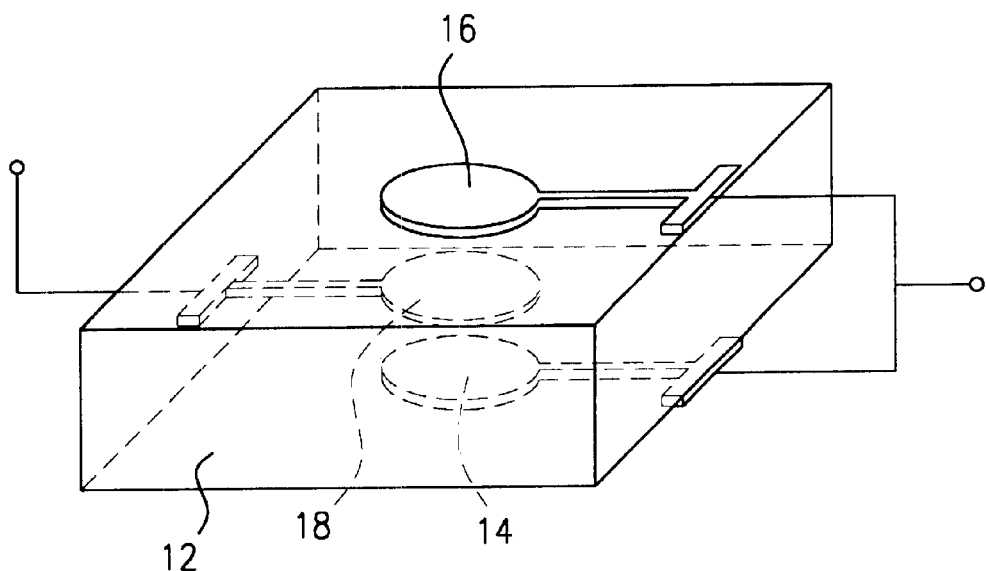
FIG. 1 is a schematic drawing showing the piezoelectric ceramic element using the piezoelectric ceramic composition according to the present invention.

The piezoelectric ceramic element as shown in FIG. 1 can be formed using the piezoelectric ceramic composition as described above. The piezoelectric ceramic element 10 comprises, for example, a rectangular parallelpiped piezoelectric ceramic 12. Electrodes 14 and 16 are formed at the centers of the both principal faces of the piezoelectric ceramic 12, respectively. The electrodes 14 and 16 are formed, for example, as circles extending to the same side edge of the piezoelectric ceramic 12. A circular inner electrode 18 is also formed within the piezoelectric ceramic 12 so as to be in a opposed relation to the electrodes 14 and 16. This inner electrode 18 extends to the other side face of the piezoelectric ceramic 12, which is opposite to the side face to which electrodes 14 and 16 extend.

Figure 2:
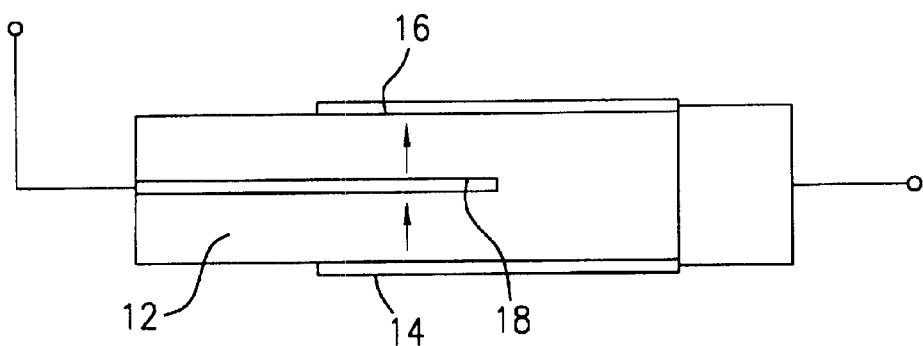
FIG. 2 is a schematic drawing showing electrical connections in the piezoelectric ceramic element shown in FIG. 1.

In the piezoelectric ceramic element 10 as described above, the piezoelectric ceramic 12 is polarized, for example, from the electrode 14 side toward the electrode 16 side as shown in FIG. 2. The electrodes 14 and 16 are connected one another, and signals are introduced between these connected portions and the inner electrode 18. The piezoelectric ceramic element 10 serves as a piezoelectric vibrator by input of the signals. The piezoelectric ceramic 12 can be obtained by firing the foregoing piezoelectric ceramic composition at a temperature of 1100° C. or less in the piezoelectric ceramic element 10. Accordingly, metals such as silver having a low melting point may be used for forming the inner electrode 18, enabling a piezoelectric ceramic element 10 to be cheaply obtained. Moreover, the piezoelectric ceramic 12 using the piezoelectric ceramic element 10 can attain an electromechanical coupling coefficient of 10% or more.

The present invention can be applied for the element construction as shown in the foregoing piezoelectric ceramic vibrator 10, as well as for other piezoelectric ceramic elements such as a piezoelectric ceramic vibrator, piezoelectric ceramic filter and piezoelectric ceramic oscillator taking advantage of oscillation modes oscillating with the foregoing element construction (for example, a longitudinal oscillation and a longitudinal tertiary harmonic wave).

EXAMPLE $CaCO_3$, $Bi_2CO_3$, $TiO_2$, $MgCO_3$, $SrCO_3$, $BaCO_3$, $La_2O_3$, $Nd_2O_3$, $Sm_2O_3$, $Y_2O_3$, $SiO_2$ and $MnCO_3$ were prepared as starting materials. These materials were weighed to be compositions of $(Ca_{1-x}M'_x)Bi_4(Ti_{1-y}Si_y)_4O_{15}$+z% by weight of $MnCO_3$ (M' represents a divalent metallic element other than Ca, x, y and z being within the ranges of $0\leq x\leq0.6$, $0\leq y\leq0.6$ and $0\leq z\leq6.0$), or $(Ca_{1-x}M''_x)Bi_4(Ti_{1-y}Si_y)_4O_{15}$+ z% by weight of $MnCO_3$ (M" represents a trivalent metallic element other than Bi, x, y and z being within the ranges of $0\leq x\leq0.4$, $0\leq y\leq0.6$ and $0\leq z\leq6.0$), or $(Ca_{1-a}M''_{2a/3})Bi_4(Ti_{1-y}Si_y)_4O_{15}$+z% by weight of $MnCO_3$ (M" represents a trivalent metallic element other than Bi, x, y and z being within the ranges of $0\leq a\leq0.5$, $0\leq y\leq0.6$ and $0\leq z\leq6.0$). The mixtures were obtained by wet-mixing one of the weighed materials for 4 hours using a ball-mill. The mixture obtained was dried and calcined at a temperature of 700° C. to 900° C. to obtain a calcination product. This calcination product was wet-ground with a ball-mill by adding an appropriate amount of an organic binder, followed by grain size adjustment through a 40 mesh sieve.

The material obtained was molded into a disk with a dimension of 12.5 mm in diameter and 1 mm in thickness with a pressure of 1000 kg/cm$^2$, and the disk was fired at 1050° C. to 1150° C. in the air to obtain a disk-shaped ceramic. A silver paste was coated on both principal faces of the ceramic to form silver electrodes after baking. The ceramic disk was subjected to a polarization treatment by impressing a direct current voltage of 5 to 10 kV/mm for 10 to 30 minutes at 150° C. to 200° C. in an insulation oil, thereby obtaining a piezoelectric ceramic sample. The electromechanical coupling coefficient kt was measured with respect to each sample obtained. The results are shown in TABLES 1, 2, 3 and 4. In these tables, the mark (*) in the sample no. denotes that the sample is out of the range of the present invention.

TABLE 1

| Sample No. | M' | x | y | z | Firing Temperature (° C.) | Density (g/cm²) | Kt (%) |
|---|---|---|---|---|---|---|---|
| 1* |  | 0 | 0 | 0 | 1150 | 6.87 | 14.3 |
| 2* |  | 0 | 0 | 0 | 1100 | 6.34 | Polarization Impossible |
| 3 |  | 0 | 0.1 | 0 | 1100 | 6.91 | 12.5 |
| 4 |  | 0 | 0.3 | 0 | 1100 | 6.92 | 12.6 |
| 5 |  | 0 | 0.5 | 0 | 1100 | 6.88 | 12.9 |
| 6* |  | 0 | 0.6 | 0 | 1100 | 6.56 | Polarization Impossible |
| 7 |  | 0 | 0.1 | 0.5 | 1100 | 6.85 | 12.8 |
| 8 |  | 0 | 0.3 | 0.5 | 1100 | 6.93 | 13.1 |
| 9 |  | 0 | 0.5 | 0.5 | 1100 | 6.85 | 12.6 |
| 10* |  | 0 | 0.6 | 0.5 | 1100 | 6.62 | 9.0 |
| 11 |  | 0 | 0.1 | 1.0 | 1100 | 6.98 | 12.9 |
| 12 |  | 0 | 0.5 | 1.0 | 1100 | 7.00 | 12.1 |
| 13 |  | 0 | 0.1 | 5.0 | 1100 | 7.04 | 11.8 |
| 14 |  | 0 | 0.3 | 5.0 | 1100 | 7.02 | 11.9 |
| 15 |  | 0 | 0.5 | 5.0 | 1100 | 7.02 | 11.2 |
| 16* |  | 0 | 0.6 | 5.0 | 1100 | 6.58 | 8.9 |
| 17 |  | 0 | 0.1 | 6.0 | 1100 | 6.45 | 10.2 |
| 18* | Mg | 0.05 | 0 | 0.5 | 1100 | 6.58 | 7.9 |
| 19* | Mg | 0.1 | 0 | 0.5 | 1100 | 6.67 | 8.1 |
| 20* | Mg | 0.3 | 0 | 0.5 | 1100 | 6.48 | 8.0 |
| 21* | Mg | 0.5 | 0 | 0.5 | 1100 | 6.52 | 7.6 |
| 22 | Mg | 0.05 | 0.1 | 0.5 | 1100 | 6.88 | 16.5 |
| 23 | Mg | 0.1 | 0.1 | 0.5 | 1100 | 7.01 | 17.9 |
| 24 | Mg | 0.3 | 0.1 | 0.5 | 1100 | 6.88 | 16.8 |
| 25 | Mg | 0.5 | 0.1 | 0.5 | 1100 | 6.89 | 14.2 |
| 26 | Mg | 0.6 | 0.1 | 0.5 | 1100 | 6.11 | 10.2 |

TABLE 2

| Sample No. | M' | x | y | z | Firing Temperature (° C.) | Density (g/cm²) | Kt (%) |
|---|---|---|---|---|---|---|---|
| 27 | Mg | 0.05 | 0.3 | 0.5 | 1100 | 6.99 | 17.2 |
| 28 | Mg | 0.1 | 0.3 | 0.5 | 1100 | 6.96 | 18.9 |
| 29 | Mg | 0.3 | 0.3 | 0.5 | 1100 | 6.92 | 16.2 |
| 30 | Mg | 0.5 | 0.3 | 0.5 | 1100 | 6.92 | 14.3 |
| 31 | Mg | 0.05 | 0.3 | 0.5 | 1100 | 6.89 | 15.5 |
| 32 | Mg | 0.1 | 0.5 | 0.5 | 1100 | 7.03 | 17.0 |
| 33 | Mg | 0.3 | 0.5 | 0.5 | 1100 | 7.05 | 15.2 |
| 34 | Mg | 0.5 | 0.5 | 0.5 | 1100 | 6.85 | 14.0 |
| 35* | Mg | 0.05 | 0.6 | 0.5 | 1100 | 6.15 | 8.5 |
| 36* | Mg | 0.1 | 0.6 | 0.5 | 1100 | 6.24 | 8.1 |
| 37* | Mg | 0.3 | 0.6 | 0.5 | 1100 | 6.25 | Polarization Is Impossible |
| 38* | Mg | 0.5 | 0.6 | 0.5 | 1100 | 6.31 | Polarization Is Impossible |
| 39 | Mg | 0.1 | 0.1 | 1.0 | 1100 | 7.01 | 14.9 |
| 40 | Mg | 0.3 | 0.1 | 1.0 | 1100 | 6.99 | 14.1 |
| 41 | Sr | 0.3 | 0.1 | 0.5 | 1100 | 7.04 | 16.5 |
| 42 | Sr | 0.5 | 0.1 | 0.5 | 1100 | 6.98 | 19.6 |
| 43 | Sr | 0.3 | 0.5 | 0.5 | 1100 | 6.90 | 17.1 |
| 44 | Sr | 0.5 | 0.5 | 0.5 | 1100 | 6.98 | 20.7 |
| 45* | Sr | 0.3 | 0.6 | 0.5 | 1100 | 6.15 | 7.6 |
| 46* | Sr | 0.5 | 0.6 | 0.5 | 1100 | 6.02 | 8.3 |
| 47 | Ba | 0.3 | 0.1 | 0.5 | 1100 | 6.86 | 14.4 |
| 48 | Ba | 0.5 | 0.1 | 0.5 | 1100 | 6.87 | 13.5 |
| 49 | Ba | 0.3 | 0.5 | 0.5 | 1100 | 7.04 | 15.3 |
| 50 | Ba | 0.5 | 0.5 | 0.5 | 1100 | 7.04 | 14.0 |
| 51* | Ba | 0.3 | 0.6 | 0.5 | 1100 | 6.43 | 8.3 |
| 52* | Ba | 0.5 | 0.6 | 0.5 | 1100 | 6.24 | Polarization Is Impossible |

TABLE 3

| Sample No. | M" | x | y | z | Firing Temperature (° C.) | Density (g/cm²) | Kt (%) |
|---|---|---|---|---|---|---|---|
| 53 | La | 0.1 | 0.1 | 0.5 | 1100 | 7.00 | 17.5 |
| 54 | La | 0.3 | 0.1 | 0.5 | 1100 | 6.95 | 18.9 |
| 55 | La | 0.1 | 0.5 | 0.5 | 1100 | 6.98 | 16.8 |
| 56 | La | 0.3 | 0.5 | 0.5 | 1100 | 6.89 | 19.5 |
| 57 | La | 0.4 | 0.5 | 0.5 | 1100 | 6.02 | 10.2 |
| 58* | La | 0.1 | 0.6 | 0.5 | 1100 | 6.35 | 8.5 |
| 59* | La | 0.3 | 0.6 | 0.5 | 1100 | 3.22 | 7.9 |
| 60 | Nd | 0.1 | 0.1 | 0.5 | 1100 | 7.01 | 18.9 |
| 61 | Nd | 0.1 | 0.5 | 0.5 | 1100 | 7.02 | 20.9 |
| 62* | Nd | 0.1 | 0.6 | 0.5 | 1100 | 6.55 | 7.9 |
| 63 | Sm | 0.1 | 0.1 | 0.5 | 1100 | 6.93 | 17.4 |
| 64 | Sm | 0.1 | 0.5 | 0.5 | 1100 | 6.91 | 17.9 |
| 65* | Sm | 0.1 | 0.6 | 0.5 | 1100 | 6.30 | Polarization Is Impossible |
| 66 | Y | 0.1 | 0.1 | 0.5 | 1100 | 6.87 | 19.5 |
| 67 | Y | 0.1 | 0.5 | 0.5 | 1100 | 6.88 | 21.0 |
| 68* | Y | 0.1 | 0.6 | 0.5 | 1100 | 5.99 | Polarization Is Impossible |

TABLE 4

| Sample No. | M" | x | y | z | Firing Temperature (° C.) | Density (g/cm²) | Kt (%) |
|---|---|---|---|---|---|---|---|
| 69 | La | 0.15 | 0.1 | 0.5 | 1100 | 6.98 | 17.2 |
| 70 | La | 0.45 | 0.1 | 0.5 | 1100 | 6.95 | 18.5 |
| 71 | La | 0.5 | 0.1 | 0.5 | 1100 | 6.22 | 10.7 |
| 72 | La | 0.15 | 0.5 | 0.5 | 1100 | 6.98 | 16.3 |
| 73 | La | 0.45 | 0.5 | 0.5 | 1100 | 6.89 | 19.7 |
| 74* | La | 0.15 | 0.6 | 0.5 | 1100 | 6.35 | Polarization Is Impossible |
| 75* | La | 0.45 | 0.6 | 0.5 | 1100 | 6.25 | Polarization Is Impossible |
| 76 | Nd | 0.15 | 0.1 | 0.5 | 1100 | 7.01 | 19.1 |
| 77 | Nd | 0.15 | 0.5 | 0.5 | 1100 | 6.93 | 18.9 |
| 78 | Nd | 0.45 | 0.1 | 0.5 | 1100 | 6.99 | 18.3 |
| 79 | Nd | 0.45 | 0.5 | 0.5 | 1100 | 6.91 | 18.1 |
| 80* | Nd | 0.15 | 0.6 | 0.5 | 1100 | 6.23 | 7.6 |
| 81* | Nd | 0.15 | 0.6 | 0.5 | 1100 | 6.30 | Polarization Is Impossible |
| 82 | Sm | 0.15 | 0.1 | 0.5 | 1100 | 6.87 | 18.4 |
| 83 | Sm | 0.15 | 0.5 | 0.5 | 1100 | 6.88 | 18.2 |
| 84* | Sm | 0.15 | 0.6 | 0.5 | 1100 | 5.99 | Polarization Is Impossible |
| 85 | Y | 0.15 | 0.1 | 0.5 | 1100 | 6.98 | 18.2 |
| 86 | Y | 0.15 | 0.5 | 0.5 | 1100 | 7.00 | 17.4 |
| 87* | Y | 0.15 | 0.6 | 0.5 | 1100 | 6.55 | 8.0 |

As is made clear from TABLES 1 to 4, firing at a temperature of 1100° C. or below was possible using the piezoelectric ceramic composition within the range of the present invention. The electromechanical coupling coefficient kt could also fall within a practical range of 10% or more. The piezoelectric ceramic composition preferably contains no divalent metallic element M', or when M' is present, the range of x is preferably limited within the range of $0 < x \leq 0.5$ because when x exceeds 0.5, the electromechanical coupling coefficient kt is rather decreased as compared with the composition with x=0, or the composition not containing M', as shown in the sample No. 26, to make the presence of M' ineffective.

It is also preferable that the piezoelectric ceramic composition does not contain the trivalent metallic element M", or when M" is present, x is limited within the range of $0 < x \leq 0.3$ because when x exceeds 0.3, the electromechanical coupling coefficient kt is rather decreased as compared with the composition with x=0, or the composition not containing M", as shown in the sample No. 57, to make the presence of M" ineffective.

It is also preferable that the piezoelectric ceramic composition does not contain any trivalent metallic element M" in the third embodiment, or when M" is present, x is limited within the range of $0 \leq x \leq 0.45$ because when x exceeds 0.45, the electromechanical coupling coefficient kt is rather decreased as compared with the composition with x=0, or the composition not containing M", as shown in the sample No. 71, to make the presence of M" ineffective.

The range of y is determined to be $0<y \leq 0.5$ because when y is zero, the molded body is not sufficiently sintered at a sintering temperature of 1100° C. or below as shown in the sample No. 1, an electromechanical coupling coefficient kt sufficient for practical use cannot be obtained as shown in the sample Nos. 18, 19, 20 and 21, or polarization of the ceramic is impossible as shown in the sample No. 2.

When y exceeds 0.5, on the other hand, an electromechanical coupling coefficient kt sufficient for practical use cannot be obtained as shown in the sample Nos. 10. 16, 35, 36, 45, 46, 51, 58, 59, 62, 80 and 87, or polarization of the ceramic is impossible as shown in the sample Nos. 6, 37, 38, 52, 65, 68, 74, 75, 81 and 84.

The amount of addition of manganese is preferably about 5.0% by weight or less because when the amount of addition is larger than about 5.0% by weight, the electromechanical coupling coefficient kt is rather decreased as compared with the piezoelectric ceramic composition with z=0, or containing no Mn, as shown in the sample No. 17, to make the presence of Mn ineffective.

The effect of the present invention is evidently displayed when M' in the general formula is at least one of the elements Mg, Ba and Sr, or when M" in the general formula is at least one of the elements La, Ce, Pr, Nd, Sm, Gd, Dy, Er, Yb, Se and Y as shown in TABLES 1 to 4. The piezoelectric ceramic composition is not restricted to those shown in this example, but any compositions are effective provided that they are within the spirit of the present invention.

According to the present invention, a piezoelectric ceramic composition capable of being sintered at a temperature of 1100° C. or below can be obtained. The piezoelectric ceramic obtained by using the piezoelectric ceramic composition according to the present invention can ensure an electromechanical coupling coefficient kt of 10% or more, that is, a value high enough to put the piezoelectric ceramic element into practical use. Accordingly, inner electrodes may be formed using such electrode materials as silver having a low melting point, thereby enabling the piezoelectric ceramics to be cheaply obtained. It is needless to say that pollution with lead dusts can be prevented since the piezoelectric ceramic composition does not contain any lead, thereby making it possible to avoid the need for special facilities such as filters for removing lead dusts and thereby possibly decrease the production cost.

What is claimed is:

1. A piezoelectric ceramic composition comprising a principal component represented by the general formula $CaBi_4Ti_4O_{15}$ and which further comprises Si.

2. A piezoelectric ceramic composition comprising a principal component represented by the general formula $(Ca_{1-x}M_x)Bi_4(Ti_{1-y}Si_y)_4O_{15}$ or $(Ca_{1-a}M''_{2a/3})Bi_4(Ti_{1-y}Si_y)_4O_{15}$ wherein M is M' or M", M' is a divalent metallic element other than Ca, M" is a trivalent metallic element other than Bi, $0<y \leq 0.5$, $0 \leq x \leq 0.5$ and $0<a \leq 0.45$.

3. A piezoelectric ceramic composition according to claim 2, containing about 5.0% by weight or less of manganese calculated as $MnCO_3$ relative to 100% parts by weight of the principal component.

4. A piezoelectric ceramic element comprising the piezoelectric ceramic composition according to claim 2 having electrodes of surfaces thereof.

5. A piezoelectric ceramic composition according to claim 2 wherein the principal component is of formula $(Ca_{1-x}M_x)Bi_4(Ti_{1-y}Si_y)_4O_{15}$ and x is 0, thereby being represented by the formula $CaBi_4(Ti_{1-y}Si_y)_4O_{15}$.

6. A piezoelectric ceramic composition according to claim 5, containing about 5.0% by weight or less of manganese calculated as $MnCO_3$ relative to 100% parts by weight of the principal component.

7. A piezoelectric ceramic element comprising the piezoelectric ceramic composition according to claim 5 having electrodes of surfaces thereof.

8. A piezoelectric ceramic composition according to claim 2 wherein the principal component is of formula $(Ca_{1-x}M_x)Bi_4(Ti_{1-y}Si_y)_4O_{15}$ and x is greater than 0, thereby being represented by the formula $(Ca_{1-x}M_x)Bi_4(Ti_{1-y}Si_y)_4O_{15}$.

9. A piezoelectric ceramic composition according to claim 8, containing about 5.0% by weight or less of manganese calculated as $MnCO_3$ relative to 100% parts by weight of the principal component.

10. A piezoelectric ceramic element comprising the piezoelectric ceramic composition according to claim 8 having electrodes of surfaces thereof.

11. A piezoelectric ceramic composition according to claim 8, wherein x is within the range of $0<x \leq 0.3$ and M is M".

12. A piezoelectric ceramic composition according to claim 8, wherein M is at least one element selected from the group consisting of Mg, Sr, Ba, La, Ce, Pr, Nd, Sm, Gd, Dy, Er, Yb, Sc and Y.

13. A piezoelectric ceramic composition according to claim 12, wherein the principal component is represented by the general formula $(Ca_{1-a}M''_{2a/3})Bi_4(Ti_{1-y}Si_y)_4O_{15}$ wherein $0<a \leq 0.45$.

14. A piezoelectric ceramic composition according to claim 13, containing about 5.0% by weight or less of manganese calculated as $MnCO_3$ relative to 100% parts by weight of the principal component.

15. A piezoelectric ceramic element comprising the piezoelectric ceramic composition according to claim 13 having electrodes of surfaces thereof.

16. A piezoelectric ceramic composition according to claim 13, wherein M" is at least one element selected from the group consisting of La, Ce, Pr, Nd, Sm, Gd, Dy, Er, Yb, Sc and Y.

17. A piezoelectric ceramic composition comprising a principal component represented by the general formula of $CaBi_4Ti_4O_{15}$, containing about 0.5 mol or less (excluding zero) of Si relative to 1 mol of Bi in the principal component represented by said general formula, and containing about 0.125 mol or less (excluding zero) of a divalent metallic element other than Ca relative to 1 mol of Bi in the principal component represented by said general formula, or about 0.075 mol or less (excluding zero) of a trivalent metallic element other than Bi relative to 1 mol of Bi in the principal component represented by said general formula.

18. A piezoelectric ceramic composition according to claim 17, containing about 5.0% by weight or less of manganese calculated as $MnCO_3$ relative to 100% parts by weight of the principal component.

19. A piezoelectric ceramic composition according to claim 18, wherein the divalent metallic element or the trivalent metallic element contained in the principal component is at least one element selected from the group consisting of Mg, Sr, Ba, La, Ce, Pr, Nd, Sm, Gd, Dy, Er, Yb, Sc and Y.

20. A piezoelectric ceramic element comprising the piezoelectric ceramic composition according to claim 18 having electrodes of surfaces thereof.

* * * * *